United States Patent
Oi

(10) Patent No.: US 7,678,681 B2
(45) Date of Patent: Mar. 16, 2010

(54) ELECTRONIC COMPONENT BUILT-IN SUBSTRATE AND METHOD OF MANUFACTURING THE SAME

(75) Inventor: Kiyoshi Oi, Nagano (JP)

(73) Assignee: Shinko Electric Industries, Co., Ltd., Nagano-shi (JP)

( * ) Notice: Subject to any disclaimer, the term of this patent is extended or adjusted under 35 U.S.C. 154(b) by 297 days.

(21) Appl. No.: 11/797,552

(22) Filed: May 4, 2007

(65) Prior Publication Data

US 2007/0262452 A1    Nov. 15, 2007

(30) Foreign Application Priority Data

May 11, 2006    (JP)    .............................. 2006-132497

(51) Int. Cl.
*H01L 21/44* (2006.01)
*H01L 29/40* (2006.01)
*H01L 23/48* (2006.01)
(52) U.S. Cl. .................. 438/615; 257/781; 257/738
(58) Field of Classification Search ......... 257/737–741, 257/780, 781, E23.141–E23.179; 438/612–615; 228/180, 245
See application file for complete search history.

(56) References Cited

U.S. PATENT DOCUMENTS

| | | | | |
|---|---|---|---|---|
| 5,197,185 | A * | 3/1993 | McCoy et al. .................. | 29/848 |
| 5,956,605 | A * | 9/1999 | Akram et al. ............... | 438/613 |
| 2002/0089067 | A1* | 7/2002 | Crane et al. .................. | 257/778 |
| 2003/0178716 | A1* | 9/2003 | Maeda et al. ............... | 257/686 |
| 2004/0207077 | A1* | 10/2004 | Leal et al. .................... | 257/723 |
| 2005/0140248 | A1* | 6/2005 | Kuniyasu et al. ............ | 310/334 |
| 2005/0258447 | A1 | 11/2005 | Oi et al. | |

FOREIGN PATENT DOCUMENTS

| | | |
|---|---|---|
| JP | 2002-314245 | 10/2002 |
| JP | 2005-327984 | 11/2005 |

* cited by examiner

*Primary Examiner*—Calvin Lee
(74) *Attorney, Agent, or Firm*—Kratz, Quintos & Hanson, LLP

(57) ABSTRACT

In an electronic component built-in substrate of the present invention, an electronic component is mounted on a mounted body having a first wiring layer, the electronic component is embedded in an insulating layer, a conductive ball is arranged to pass through the insulating layer and connected electrically to the first wiring layer, a second wiring layer connected electrically to the conductive ball is formed on the insulating layer, and the first wiring layer and the second wiring layer are interlayer-connected via the conductive ball.

9 Claims, 10 Drawing Sheets

US 7,678,681 B2

ELECTRONIC COMPONENT BUILT-IN SUBSTRATE AND METHOD OF MANUFACTURING THE SAME

CROSS-REFERENCE TO RELATED APPLICATIONS

This application is based on and claims priority of Japanese Patent Application No.2006-132497 filed on May 11, 2006, the entire contents of which are incorporated herein by reference.

BACKGROUND OF THE INVENTION

1. Field of the Invention

The present invention relates to an electronic component built-in substrate and a method of manufacturing the same and, more particularly, an electronic component built-in substrate having such a structure that an electronic component is mounted on the substrate in a state that the electronic component is embedded in an insulating layer and a method of manufacturing the same.

2. Description of the Related Art

In the prior art, there is the electronic component built-in substrate having such a structure that an electronic component is mounted on the substrate in a state that the electronic component is embedded in an insulating layer. As shown in FIG. 1, in the electronic component built-in substrate in the prior art, through holes 100x passing through a core substrate 100 are provided in this core substrate, and a through-hole plating layer 110 is formed on inner surfaces of the through holes 100x. A resin 130 is filled in the through holes 100x. A first wiring layer 120 is formed on both surface sides of the core substrate 100 respectively. The first wiring layers 120 on both surface sides are connected mutually via the through-hole plating layers 110.

Also, a semiconductor chip 200 is mounted on the first wiring layer 120 on the upper surface side of the core substrate 100 such that its connection electrodes 200a are directed upward. A first insulating layer 140 and a second insulating layer 160 are formed around the semiconductor chip 200, so that the semiconductor chip 200 is buried in the first insulating layer 140 and the second insulating layer 160. First via holes V1 each having a depth reaching the first wiring layer 120 are formed in the first and second insulating layers 140, 160. Also, second via holes V2 each having a depth reaching the connection electrode 200a of the semiconductor chip 200 are formed in the second insulating layer 160. Also, a second wiring layer 180 connected to the first wiring layer 120 via the first via holes V1 and connected to the connection electrodes 200a of the semiconductor chip 200 via the second via holes V2 is formed on the second insulating layer 160.

Also, the first and second insulating layers 140, 160 are formed similarly on the first wiring layer 120 on the lower surface side of the core substrate 100, and the first via holes V1 each having a depth reaching the first wiring layer 120 are formed. Also, the second wiring layer 180 connected to the first wiring layer 120 via the first via holes V1 is formed on the second insulating layer 160.

Also, a third insulating layer 210 in which third via holes V3 are provided is formed on the second wiring layer 180 on both surface sides of the core substrate 100 respectively. Also, a third wiring layer 220 connected to the second wiring layer 180 via the third via holes V3 is formed on the third insulating layer 210 on both surface sides of the core substrate 100 respectively. Also, a solder resist film 240 in which opening portions 240x are provided on connection portions of the third wiring layer 220 is formed on the third wiring layer 220 on both surface sides of the core substrate 100 respectively.

The such electronic component built-in substrate in which the electronic component is mounted on the substrate in a state that the electronic component is embedded in the insulating layer is set forth in Patent Literature 1 (Patent Application Publication (KOKAI) 2005-327984), for example.

Also, in Patent Literature 2 (Patent Application Publication (KOKAI) 2002-314245), it is set forth that the vias are formed by inserting a copper ball into the through holes in the core substrate and then the plural-layered core substrate whose vias are connected electrically is manufactured by joining plural sheets of such core substrates together.

In the electronic component built-in substrate in the prior art, the first and second insulating layers 140, 160 in which the semiconductor chip 200 is embedded must be formed to have a film thickness enough to cover the semiconductor chip 200. Therefore, the film thickness of these insulating layers must be set considerably thicker (twice or more) than that of the ordinary interlayer insulating layer (in FIG. 1, the third insulating layer 210) in which the semiconductor chip is not embedded.

For this reason, the first via holes V1 formed in the first and second insulating layers 140, 160 in which the semiconductor chip 200 is embedded, to reach the first wiring layer 120, are larger in depth and diameter than the via holes formed in the ordinary interlayer insulating layer.

As a result, in FIG. 1, in fact, it is extremely difficult from a cost point of view to fill perfectly a metal in the first via holes V1, the volume (diameter and depth) of which is considerable large, by the electroplating. Only a metal layer is formed on inner walls of the first via holes V1, and thus the cavities often remain in the inside of the holes.

When the cavities exist in the insides of the first via holes V1, it is difficult to place the via hole just on the first via holes V1. Therefore, as shown in FIG. 1, the third via holes V3 must be shifted and placed on the second wiring layer 180 that extends laterally from the first via holes V1. As a result, such a problem exists that the stacked via structure effective in forming the multi-layered wiring with high density cannot be employed.

SUMMARY OF THE INVENTION

It is an object of the present invention to provide an electronic component built-in substrate having such a structure that an interlayer connection can be obtained by embedding easily a conductor in via holes provided in a thick insulating layer in which an electronic component is embedded and a method of manufacturing the same.

The present invention is concerned with an electronic component built-in substrate that includes a mounted body having a first wiring layer, an electronic component mounted on the first wiring layer, an insulating layer in which the electronic component is embedded, a conductive ball arranged to pass through the insulating layer and connected electrically to the first wiring layer, and a second wiring layer formed on the insulating layer and connected electrically to the conductive ball.

In the present invention, the electronic component is mounted on the mounted body (wiring substrate) having the first wiring layer, and the electronic component is embedded in the insulating layer. Also, the conductive balls connected to the first wiring layer are arranged to pass through the insulating layer, and the second wiring layer connected to the conductive balls is formed on the insulating layer. In this manner, the first wiring layer and the second wiring layer are interlayer-connected via the conductive balls arranged in the insulating layer.

As described above, the insulating layer in which the electronic component is embedded has a relatively thick film thickness. Therefore, a volume of the via holes provided in the insulating layer is increased, and it is extremely difficult to bury completely the metal in the via holes by the electroplating. In contrast, in the present invention, the conductive balls are inserted into the via holes in the insulating layer and arranged therein. Therefore, the interlayer connection can be provided by filling easily the conductor even into the via holes whose volume is large.

In this manner, a surface of the insulating layer is planarized by burying the conductive balls in the via holes. Therefore, the stack via structure in which the upper via holes are arranged just on the via holes can be employed, and thus the high-density multi-layered wiring can be built up.

Here, in above Patent Literature 2, it is set forth that the copper balls are inserted into the through holes in the core substrate, but it is not considered at all that the interlayer connection is provided by arranging the conductive balls in the thick insulating layer in which the electronic component is embedded. As a consequence, Patent Literature 2 gives no suggestion as to constitutions of the present invention.

In the present invention, lower portions of the conductive balls are connected electrically to the first wiring layer via solder layers, and upper portions of the conductive balls are directly connected electrically to the second wiring layer.

Also, in the present invention, each of the conductive balls is constructed by a copper ball and a coating portion for coating the copper ball, and the coating portions of the upper portions of the conductive balls are removed partially, and the second wiring layer is connected to the copper balls.

Also, in the present invention, a resin body may be filled into a center portion of the conductive ball. In the case of this mode, since the conductive balls have elasticity and are formed softly, such conductive balls can absorb the external stress and also reliability of the interlayer connection can be improved.

As described above, according to the present invention, the interlayer connection is implemented by arranging the conductive balls in the insulating layer in which the electronic component is embedded. Therefore, even the via holes having a large capacity can be buried easily by inserting the conductive ball therein, and thus the stacked via structure can be formed easily.

DETAILED DESCRIPTION OF THE PREFERRED EMBODIMENTS

Embodiments of the present invention will be explained with reference to the accompanying drawings hereinafter.

First Embodiment

Figure 1:
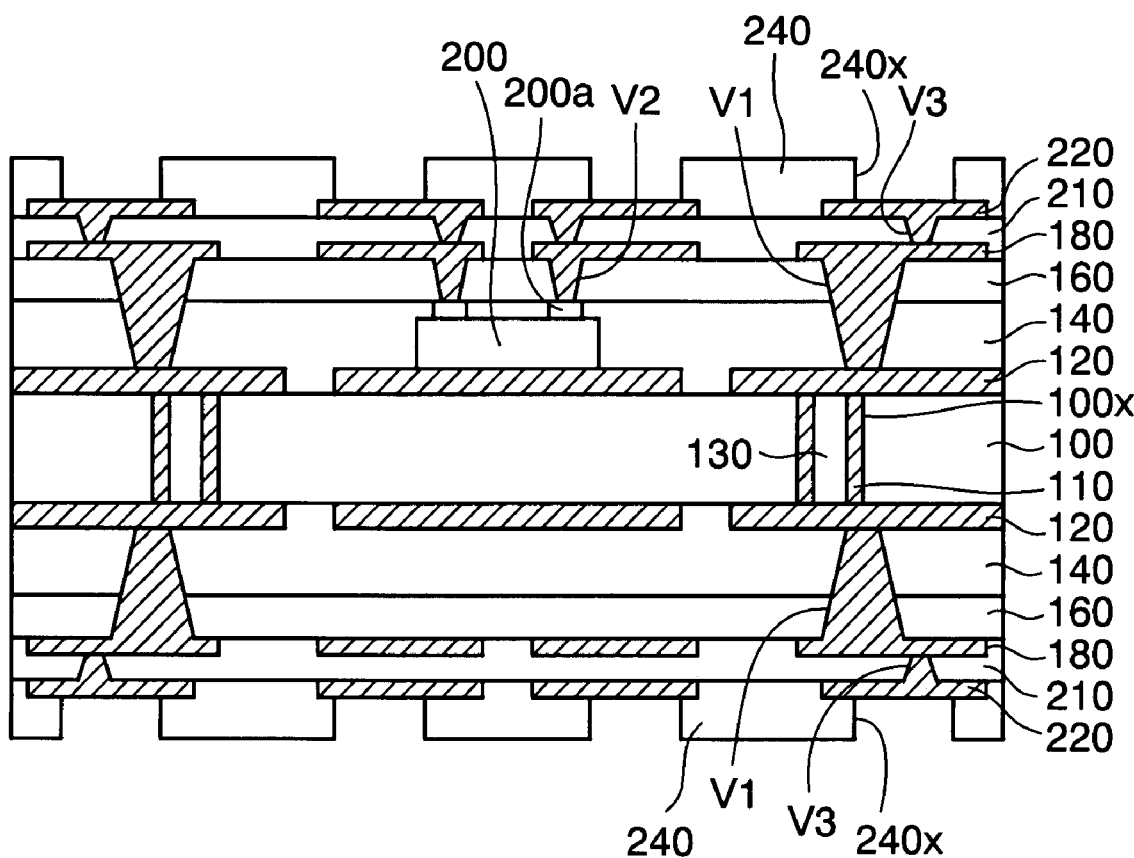
FIG. 1 is a sectional view showing an electronic component built-in substrate in the prior art.
Figure 2A:
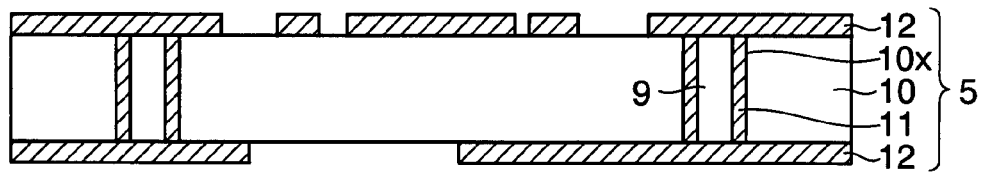
FIGS. 2A to 2J are sectional views showing a method of manufacturing an electronic component built-in substrate according to a first embodiment of the present invention.
Figure 2B:
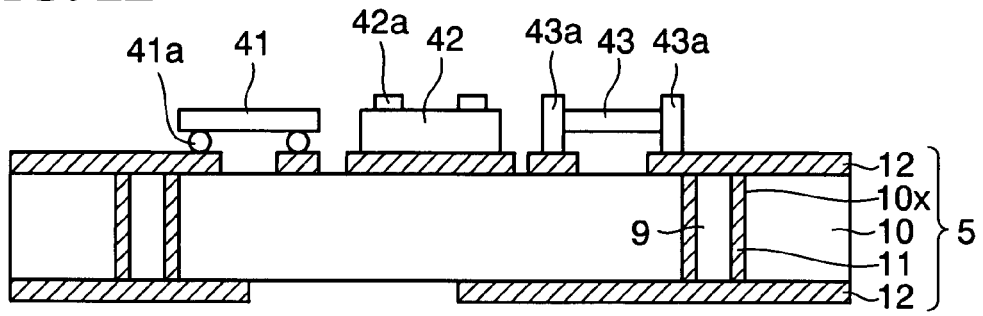
Figure 2C:
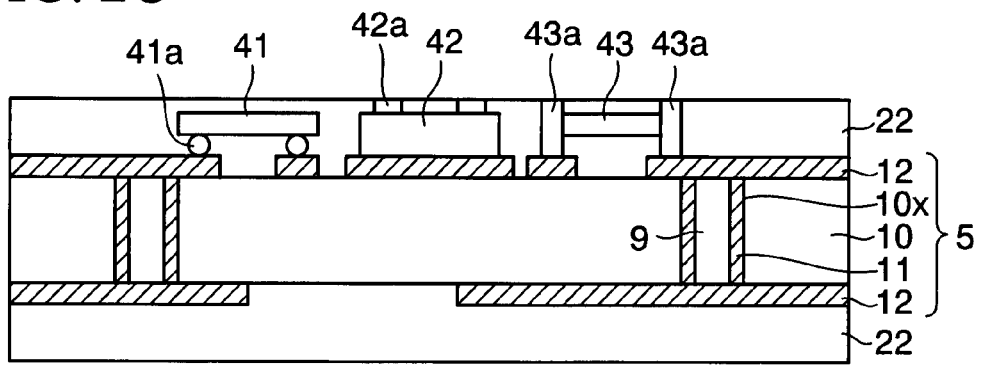
Figure 2D:
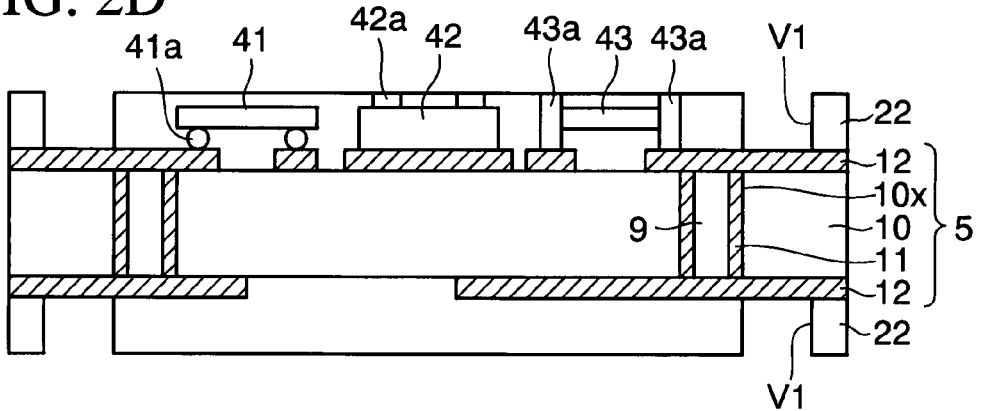
Figure 2E:
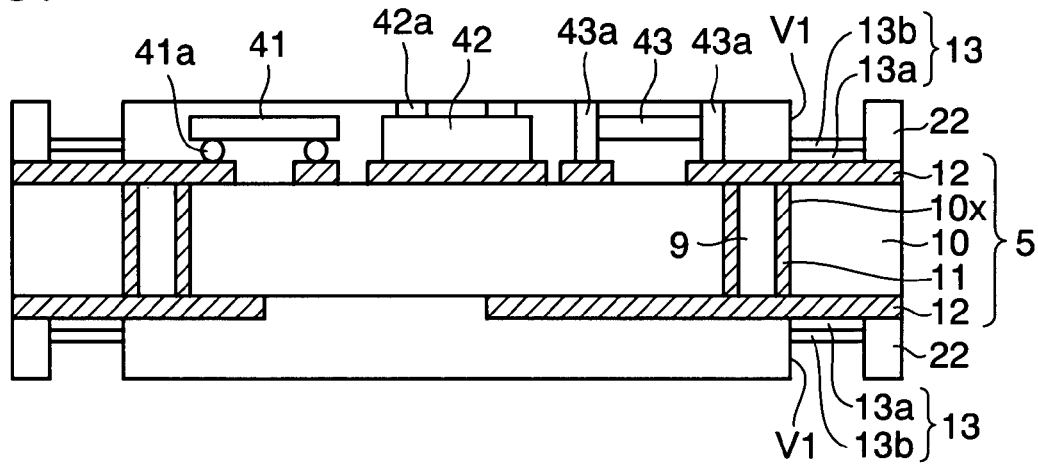
Figure 2F:
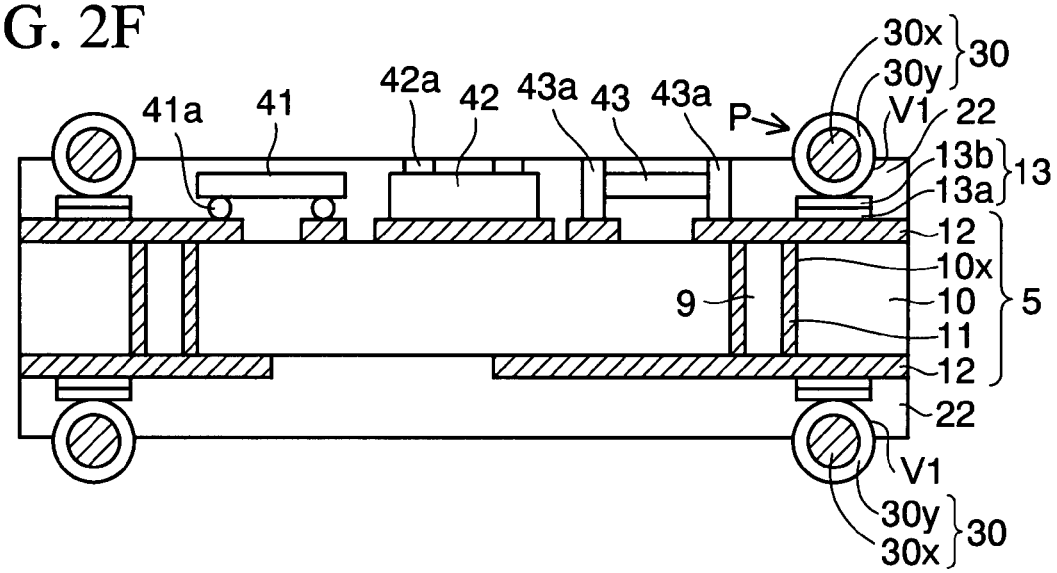
Figure 2G:
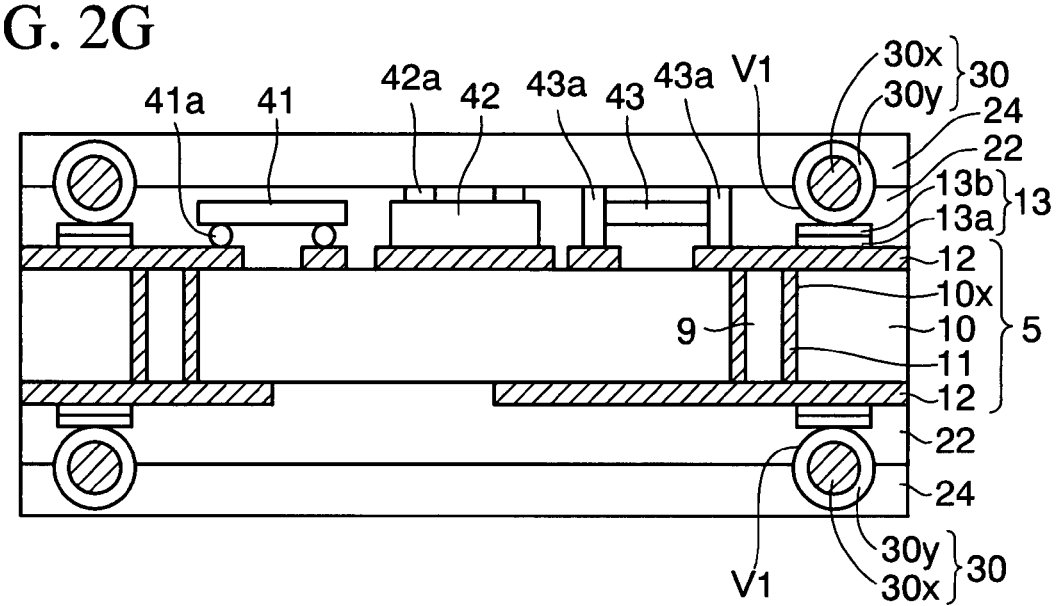
Figure 2H:
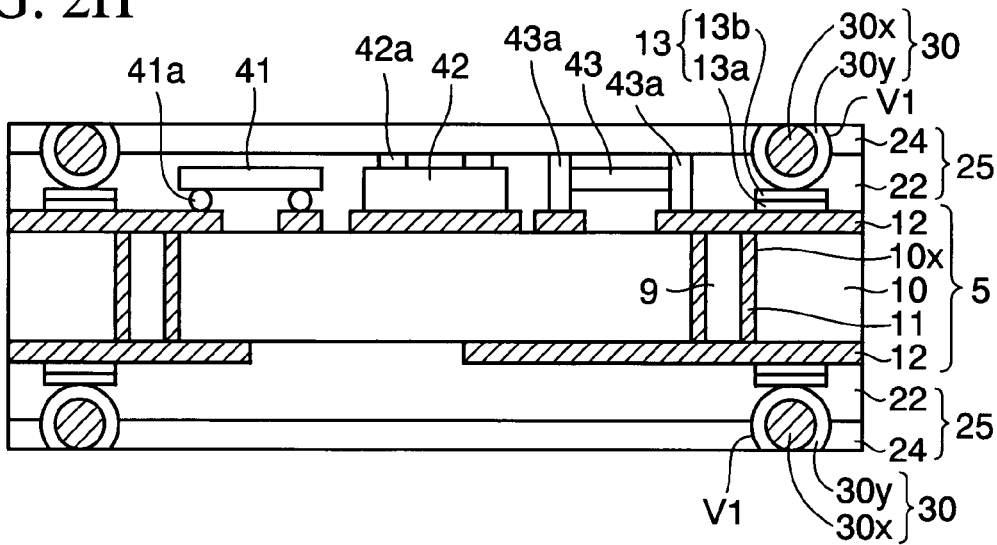
Figure 2I:
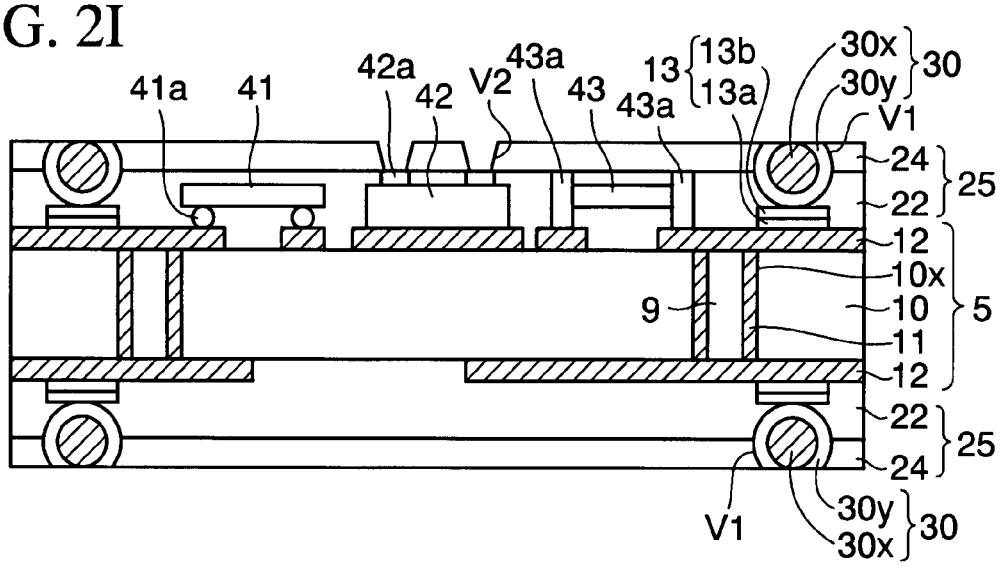
Figure 2J:
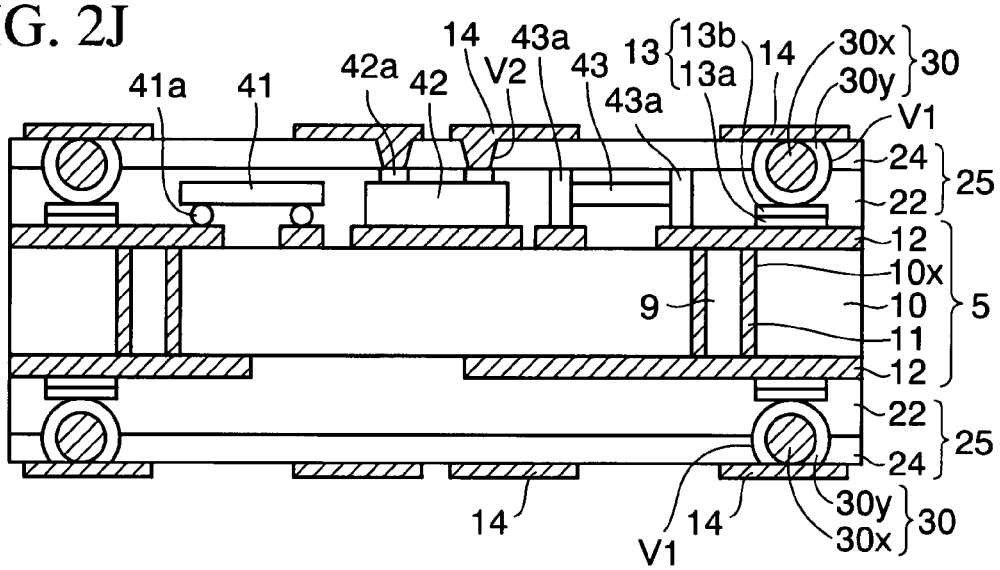
Figure 3:
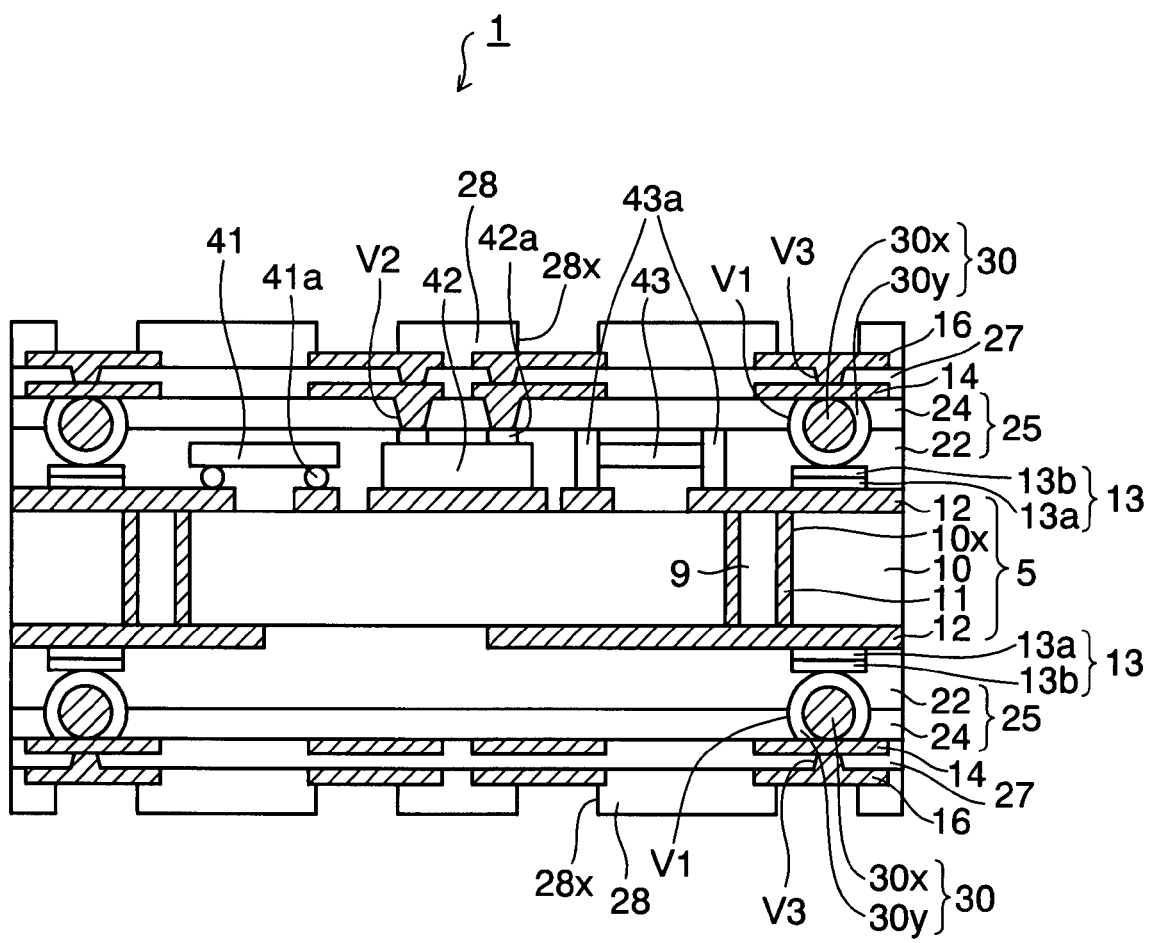
FIG. 3 is a sectional view showing an electronic component built-in substrate according to the first embodiment of the present invention.

FIGS. 2A to 2J are sectional views showing a method of manufacturing an electronic component built-in substrate according to a first embodiment of the present invention, and FIG. 3 is a sectional view showing the same electronic component built-in substrate. In the method of manufacturing the electronic component built-in substrate according to the first embodiment of the present invention, first, a mounted body 5 formed of the wiring substrate shown in FIG. 2A is prepared. In the mounted body 5, through holes 10x passing through the core substrate are provided in an insulating core substrate 10 made of a glass epoxy resin, or the like, and a through-hole plating layer 11 is formed on inner surfaces of the through holes 10x. A resin 9 is filled in inner holes of the through holes 10x. Also, first wiring layers 12 connected mutually via the through-hole plating layers 11 are formed on both surface sides of the core substrate 10.

Then, an electronic component is mounted on the upper surface side of such mounted body 5. In an example in FIG. 2B, a first semiconductor chip 41, a second semiconductor chip 42, and a capacitor component 43 are mounted as the electronic component. The first semiconductor chip 41 is mounted by flip-chip connecting bumps 41a to the first wiring layer 12. Also, the second semiconductor chip 42 is adhered onto the first wiring layer 12 and mounted in a state that its connection electrodes 42a are directed upward (face up). Also, the capacitor component 43 is mounted by connecting a pair of electrodes 43a provided to both ends to the first wiring layer 12 in a state that the electrodes 43a are arranged in the horizontal direction.

Then, as shown in FIG. 2C, a buried insulating layer 22 is formed on the first and second semiconductor chips 41, 42 and the capacitor component 43 by pasting a resin film, or the like after an underfill resin (not shown) is filled in a clearance under the first semiconductor chip 41. Accordingly, the first and second semiconductor chips 41, 42 and the capacitor component 43 are embedded in the buried insulating layer 22. In an example in FIG. 2C, the buried insulating layer 22 is formed such that the connection electrodes 42a of the second semiconductor chip 42 and the electrodes 43a of the capacitor component 43 are exposed. A film thickness of the buried insulating layer 22 may be set to either bury the electronic component partially or bury the electronic component completely. Then, the similar buried insulating layer 22 is formed on the first wiring layer 12 on the lower surface side of the mounted body 5. In this case, the electronic component may also be mounted on the lower surface side of the mounted body 5, and then the electronic component may be embedded in the buried insulating layer 22.

Then, as shown in FIG. 2D, the buried insulating layer 22 on both surface sides of the mounted body 5 are processed by the laser, or the like. Thus, first via holes V1 each having a depth reaching the first wiring layer 12 are formed on both surface sides. Then, the first via holes V1 are cleaned by the desmear process respectively.

Then, as shown in FIG. 2E, a nickel (Ni) layer 13a and a solder layer 13b are formed sequentially on the first wiring layer 12 in the first via holes V1 on both surface sides of the mounted body 5 by the electroplating, or the like. Thus, connection portions 13 are formed on both surface sides.

Figure 4:
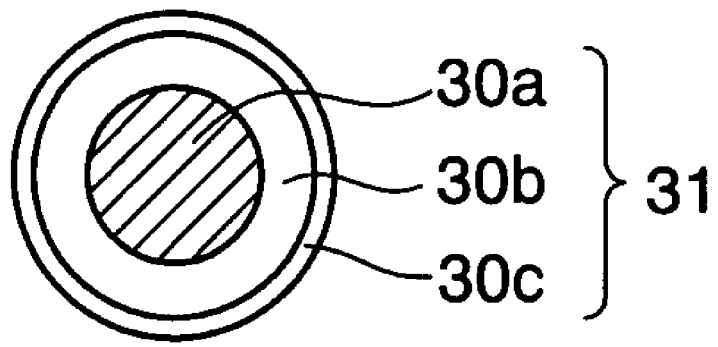
FIG. 4 is a sectional view showing a first conductive ball used in the electronic component built-in substrate according to the embodiment of the present invention.
Figure 5:
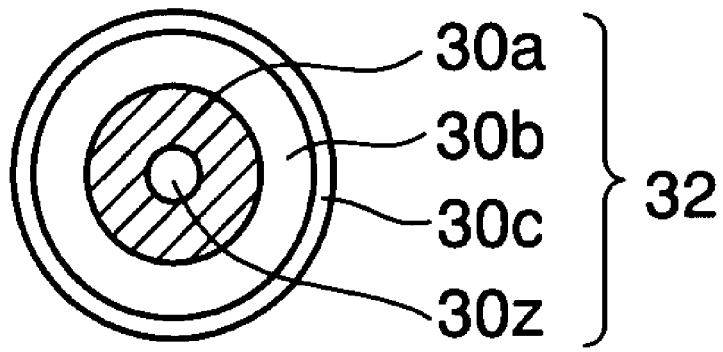
FIG. 5 is a sectional view showing a second conductive ball used in the electronic component built-in substrate according to the embodiment of the present invention.

Then, as shown in FIG. 2F, conductive balls 30 each constructed by a ball portion 30x and a coating portion 30y for coating an outer surface of the ball portion 30x are prepared. The conductive ball 30 may have various structures, and a first conductive ball 31 to a sixth conductive ball 36 are shown in FIG. 4 to FIG. 9 by way of example. As shown in FIG. 4, the first conductive ball 31 is constructed by coating a copper ball 30a with a nickel layer 30b and a gold layer 30c. Also, as shown in FIG. 5, the second conductive ball 32 is constructed by filling a resin body 30z into a center portion of the copper ball 30a of the first conductive ball 31 in FIG. 4.

Figure 6:
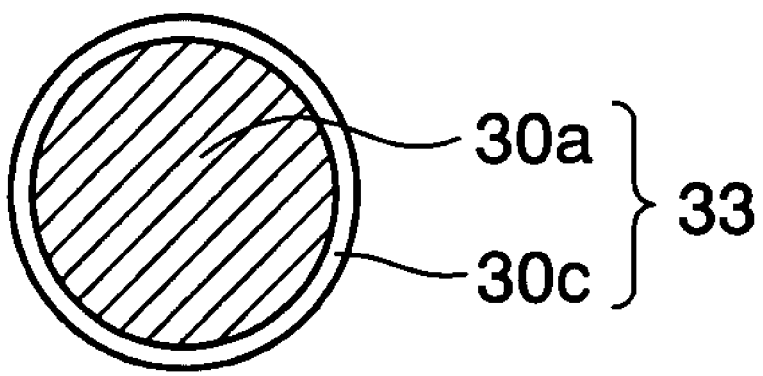
FIG. 6 is a sectional view showing a third conductive ball used in the electronic component built-in substrate according to the embodiment of the present invention.
Figure 7:
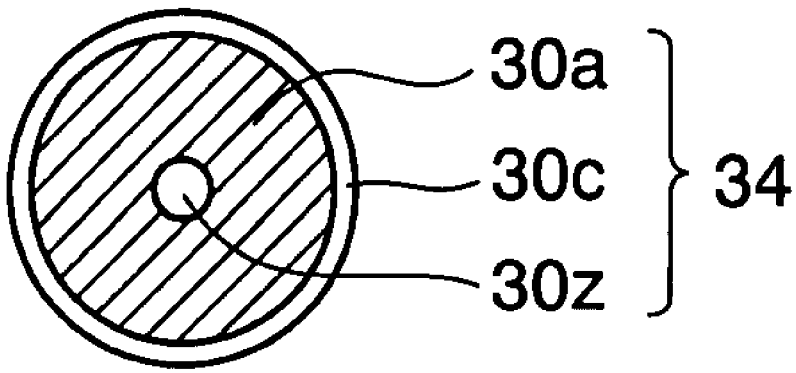
FIG. 7 is a sectional view showing a fourth conductive ball used in the electronic component built-in substrate according to the embodiment of the present invention.

Also, as shown in FIG. 6, the third conductive ball 33 is constructed by coating the copper ball 30a with the gold layer 30c. Also, as shown in FIG. 7, the fourth conductive ball 34 is constructed by filling the resin body 30z into a center portion of the copper ball 30a of the third conductive ball 33 in FIG. 6.

Figure 8:
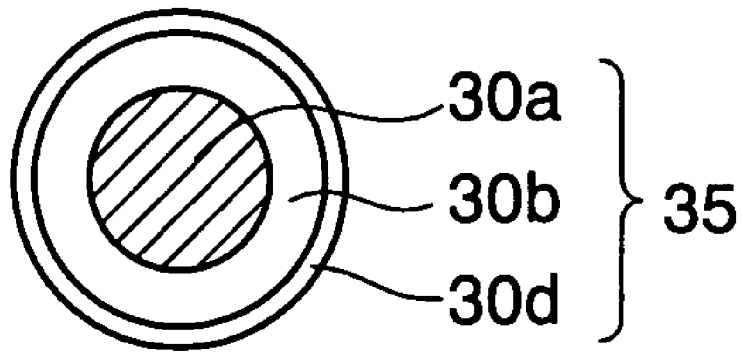
FIG. 8 is a sectional view showing a fifth conductive ball used in the electronic component built-in substrate according to the embodiment of the present invention.
Figure 9:
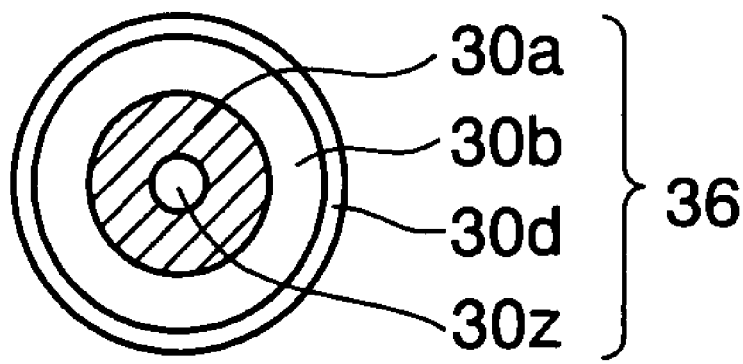
FIG. 9 is a sectional view showing a sixth conductive ball used in the electronic component built-in substrate according to the embodiment of the present invention.

Also, as shown in FIG. 8, the fifth conductive ball 35 is constructed by coating the copper ball 30a with the nickel layer 30b and a solder layer 30d. Also, as shown in FIG. 9, the sixth conductive ball 36 is constructed by filling the resin body 30z into a center portion of the copper ball 30a of the fifth conductive ball 35 in FIG. 8.

For example, an outer diameter of the conductive ball 30 is 50 to 300 μm, a thickness of the nickel layer for coating the copper ball 30a is 3 to 4 μm, a thickness of the gold layer 30c is about 0.1 μm, and a thickness of the solder layer is about 10 μm.

Returning to FIG. 2F, explanation will be continued. The conductive ball 30 having such structure is inserted into the first via holes V1 on the upper surface side of the mounted body 5 by the feeding device respectively. At this time, the conductive ball 30 is arranged in the first via holes V1 to have a projected portion P that projects from an upper surface of the first insulating layer 22. The conductive balls 30 are joined to the connection portions 13 in the first via holes V1 by melting a solder by the reflow heating. When the first to fourth conductive balls 31 to 34 an outermost surface of which is coated with the gold layer 30c are used as the conductive ball 30, the solder layers 13b of the connection portions 13 are caused to reflow and electrically connected to be joined to the gold layers 30c of the first to fourth conductive balls 31 to 34.

Also, when the fifth and sixth conductive balls 35, 36 an outermost surface of which is coated with the solder layer 30d are used as the conductive ball 30, the solder layers 13b of the connection portions 13 and the solder layers 30d of the fifth and sixth conductive balls 35, 36 are caused to reflow and electrically connected to be joined mutually.

Also, the conductive ball 30 is inserted into the first via holes V1 on the lower surface side of the mounted body 5 and arranged there respectively. Then, the conductive balls 30 are joined to the connection portions 13 in the first via holes V1 by the reflow heating.

In this manner, the conductive ball 30 is inserted into the first via holes V1 on both surface sides of the mounted body 5 respectively, and then joined to the connection portions 13 of the first wiring layer 12 respectively.

Then, as shown in FIG. 2G, a coating insulating layer 24 for covering the projected portions P of the conductive balls 30 is formed on the conductive balls 30 and the buried insulating layer 22 on both surface sides of the mounted body 5 respectively by pasting a resin film, or the like. As a result, the resin can be filled in the clearance even though the clearance is generated between the first via hole V1 and the conductive ball 30, and also the second semiconductor chip 42 and the capacitor component 43 are embedded completely in the buried insulating layer 22 and the coating insulating layer 24.

Then, as shown in FIG. 2H, the coating insulating layer 24 is polished by the buffing, or the like on both surface sides of the mounted body 5 respectively until upper portions of the conductive balls 30 are exposed. At this time, the coating portions 30y on the conductive balls 30 are removed by the polishing, and the ball portions 30x are brought into an exposed state. For example, when the first and second conductive balls 31, 32 are used, the gold layers 30c and the nickel layers 30b coated on the outer surface are removed by the polishing, and the copper balls 30a are brought into an exposed state. Also, when the third to sixth conductive balls 33 to 36 are used, similarly the gold layers 30c or the solder layers 30d and the nickel layers 30b coated on the outer surface are removed and the copper balls 30a are exposed.

With the above, a first insulating layer 25 in which the first and second semiconductor chips 41, 42 and the capacitor component 43 are embedded is constructed by the buried insulating layer 22 and the coating insulating layer 24. At this time, the first via holes V1 are formed in the first insulating layer 25 because the first via holes V1 provided in the buried insulating layer 22 are extended upward along the projected portions P of the conductive balls 30, so that the conductive balls 30 are arranged in the first via holes V1 of the first insulating layer 25.

In this fashion, the conductive balls 30 are buried in the first via holes V1 of the first insulating layer 25 not to generate a void, and the interlayer connection is provided. According to the use of such approach, even when the volume (diameter and depth) of the first via hole V1 becomes large because a film thickness of the first insulating layer 25 in which the electronic component is embedded is increased, the interlayer connection can be provided easily in very short time by inserting the conductive balls 30 into the first via holes V1.

In this case, if the first via holes V1 are formed in the buried insulating layer 22 having a film thickness enough to cover the electronic component completely and then the conductive balls 30 having a size corresponding to the volume of the first via hole V1 are inserted, the coating insulating layer 24 can be omitted.

Then, as shown in FIG. 2I, the first insulating layer 25 on the upper surface side of the mounted body 5 is processed by the laser, or the like. Thus, second via holes V2 each having a depth reaching the connection electrode 42a of the second semiconductor chip 42 are formed.

Then, as shown in FIG. 2J, a second wiring layer 14 connected to the upper portions of the conductive balls 30 (the exposed portions of the copper balls 30a) on the upper surface side of the mounted body 5 is formed on the first insulating layer 25 by the semi-additive process, or the like. At this time, simultaneously the second wiring layer 14 connected to the connection electrodes 42*a* of the second semiconductor device 42 via the second via holes V2 is formed on the first insulating layer 25. The second wiring layer 14 may be formed by a single copper layer, or may be constructed by forming a copper layer on an underlying layer that is made of a nickel (Ni) layer, a chromium (Cr) layer, or a titanium (Ti) layer or their laminated film.

In other words, when second wiring layer 14 is formed by a single copper layer, the upper portions of the conductive balls 30 (the exposed portions of the copper balls 30*a*) and the second wiring layer 14 can be connected electrically to each other by a copper-to-copper joining at a low electric resistance without intervention of the solder. Also, when second wiring layer 14 is constructed by forming the copper layer on the underlying layer, the upper portions of the conductive balls 30 (the exposed portions of the copper balls 30*a*) and the second wiring layer 14 can be connected electrically to each other by a copper-to-underlying layer (Ni, Cr, Ti, or the like) joining at a low electric resistance without intervention of the solder.

It is preferable that the upper portions of the conductive balls 30 and the second wiring layer 14 should be connected without intervention of the solder whose specific resistance is relatively high and whose mechanical strength is small. In the present embodiment, even though the conductive ball 30 an outermost surface of the coating portion 30*y* of which is formed of the solder layer 30*d* is used, the coating portion 30*y* of the conductive ball 30 is removed at a time of polishing the coating insulating layer 24. Therefore, the upper portions of the conductive balls 30 (the exposed portions of the copper balls 30*a*) and the second wiring layer 14 arranged thereon are connected electrically to each other without intervention of the solder, so that reliability of the electrical connection can be improved. In this manner, the first wiring layer 12 and the second wiring layer 14 are interlayer-connected via the conductive balls 30, which contain the copper as the main material, at a low electric resistance with good reliability.

The preferred metal material of the conductive ball 30 and its joining method are explained. In addition to this, the conductive ball made of various conductive materials can be used.

Also, in case the conductive ball in which the resin 30*z* is filled into a center portion of the copper ball 30*a* (FIG. 5, FIG. 7, FIG. 9) is used as the conductive ball 30, an external stress can be absorbed by a resin 30*z* having elasticity. As a result, even when a stress is applied from the external, it can be prevented that a crack is caused in the conductive ball 30, the neighboring first insulating layer 25, and the like, and reliability of the interlayer connection can be improved.

In the above example, the interlayer connection is provided by arranging one conductive ball 30 into the first via hole V1. But the interlayer connection may be provided by arranging plural conductive balls 30 into the first via hole V1.

Then, the second wiring layer 14 connected to the conductive balls 30 is also formed on the first insulating layer 25 on the lower surface of the mounted body 5. Then, as shown in FIG. 3, a second interlayer insulating layer 27 (upper insulating layer) is formed on the second wiring layer 14 on both surface sides of the mounted body 5 respectively. Then, third via holes V3 (upper via holes) each having a depth reaching the second wiring layer 14 on the conductive balls 30 are formed by processing the second interlayer insulating layer 27 by means of the laser, or the like respectively. In the present embodiment, since an upper surface of the first interlayer insulating layer 25 is planarized by burying the conductive balls 30 in the first via holes V1 in the first interlayer insulating layer 25, the stack via structure can be formed easily by arranging the third via holes V3 on the portions of the second wiring layer 14 just on the conductive balls 30.

Then, as also shown in FIG. 3, a third wiring layer 16 connected to the second wiring layer 14 via the third via holes V3 is formed on the second interlayer insulating layer 27 on both surface sides of the mounted body 5 respectively. Also, a solder resist film 28 in which opening portions 28*x* are provided is formed on the third wiring layer 16 on both surface sides of the mounted body 5 respectively. Then, the Ni/Au plating is applied to portions of the third wiring layer 16 in the opening portions 28*x* of the solder resist film 28 to form the connection portions (not shown).

With the above, an electronic component built-in substrate 1 of the first embodiment can be obtained.

As shown in FIG. 3, in the electronic component built-in substrate 1 of the first embodiment of the present invention, the first and second semiconductor chips 41, 42 and the capacitor component 43 are mounted on the upper surface side of the mounted body 5 having such a structure that the first wiring layer 12 connected mutually is provided on both surface sides of the core substrate 10 respectively. The bumps 41*a* of the first semiconductor chip 41 are flip-chip mounted on the first wiring layer 12. The second semiconductor chip 42 is adhered to the first wiring layer 12 in a state that the connection electrodes 42*a* are directed upward. Also, the capacitor component 43 is mounted by connecting the electrodes 43*a* provided to both ends to the first wiring layer 12.

The first and second semiconductor chips 41, 42 and the capacitor component 43 are embedded in the first insulating layer 25 constructed by the buried insulating layer 22 and the coating insulating layer 24. The first via holes V1 are formed in the portions of the first insulating layer 25 on the first wiring layer 12, while the connection portions 13 each composed of the Ni layer 13*a* and the solder layer 13*b* are provided to the portions of the first wiring layer 12 in the first via holes L1.

Also, the conductive ball 30 constructed by the ball portion 30*x* and the coating portion 30*y* is inserted into the first via holes V1 and arranged there. The coating portions 30*y* of the conductive balls 30 are joined to the connection portions 13.

As the conductive ball 30, the foregoing first to sixth conductive balls 31 to 36 (FIG. 4 to FIG. 9) are used. The outermost surfaces (gold layers 30*c* or solder layers 30*d*) of the coating portions 30*y* of the conductive balls 30 are joined to the solder layers 13*b* of the connection portions 13.

The upper portions, i.e., the coating portions 30*y* of the conductive balls 30 are removed simultaneously when the coating insulating layer 24 constituting the first insulating layer 25 is polished, and the ball portions 30*x* (copper balls) are brought into their exposed state. The second wiring layer 14 connected to the ball portions 30*x* of the conductive balls 30 is formed on the first insulating layer 25. The second wiring layer 14 is connected to the first wiring layer 12 via the conductive balls 30.

In this manner, the first wiring layer 12 and the second wiring layer 14 are interlayer-connected via the conductive balls 30 provided to pass through the first insulating layer 25.

The second wiring layer 14 is formed of the single copper layer, or is constructed by forming the copper layer on the underlying layer made of a nickel (Ni) layer, a chromium (Cr) layer, or a titanium (Ti) layer, or their laminated film. Accordingly, the upper portions of the conductive balls 30 and the second wiring layer 14 are connected electrically via a copper-to-copper joining or a copper-to-underlying layer joining. In the present embodiment, since the upper portions of the conductive balls 30 and the second wiring layer 14 are joined without intervention of the solder, contact resistance and mechanical strength can be improved and also reliability of the electric connection can be improved.

Also, the second via holes V2 each having a depth reaching the connection electrode 42a of the second semiconductor chip 42 are formed in the first insulating layer 25. The second wiring layer 14 connected to the connection electrodes 42a of the second semiconductor chip 42 via the second via holes V2 is formed on the first insulating layer 25.

Similarly, the first wiring layer 12 and the second wiring layer 14 are interlayer-connected by the conductive balls 30, which are arranged to pass through the first insulating layer 25, on the lower surface side of the mounted body 5.

Also, the second interlayer insulating layer 27 in which the third via holes V3 are provided on the portions of the second wiring layer 14 right on the conductive balls 30 is formed on the second wiring layer 14 on both surface sides of the mounted body 5 respectively. Also, the third wiring layer 16 connected to the second wiring layer 14 via the third via holes V3 is formed on the second interlayer insulating layer 27 on both surface sides respectively.

Also, the solder resist film 28 in which the opening portions 28x are provided in the portions of the third wiring layer 16 is formed on both surface sides of the mounted body 5 respectively. The connection portions (not shown) formed of the nickel/gold plating are provided on the portions of the third wiring layer 16 in the opening portions 28x respectively.

In the electronic component built-in substrate 1 of the present embodiment, the interlayer connection is provided by arranging the conductive balls 30 in the first interlayer insulating layer 25, in which the electronic component is embedded and which has a relatively thick film thickness, to pass therethrough. As a result, even when the volume of the first via hole V1 becomes large, the surface of the first interlayer insulating layer 25 can be planarized by filling the conductor into the first via holes V1 by a very simple step, unlike the method of filling the metal by means of the electroplating. As a result, the stack via structure in which the third via holes V3 are arranged right on the first via holes V1 (conductive balls 30) can be formed easily.

Also, since the interlayer connection is provided by the conductive balls 30 using the copper as the main material, the vias having a low resistance can be constructed. In addition, a crack caused due to the external stress is hard to occur in the via holes in contrast to the method of filling the solder paste, and reliability of the interlayer connection can be improved. Further, because the conductive balls 30 in the center portion of which the resin body 30z is filled can be used, the stress can be absorbed even when the external stress is applied, and also reliability of the interlayer connection can be improved further.

In this case, the interlayer connection may be provided by arranging the conductive balls in the interlayer insulating layer in which the electronic component is not embedded.

Second Embodiment

Figure 10A:
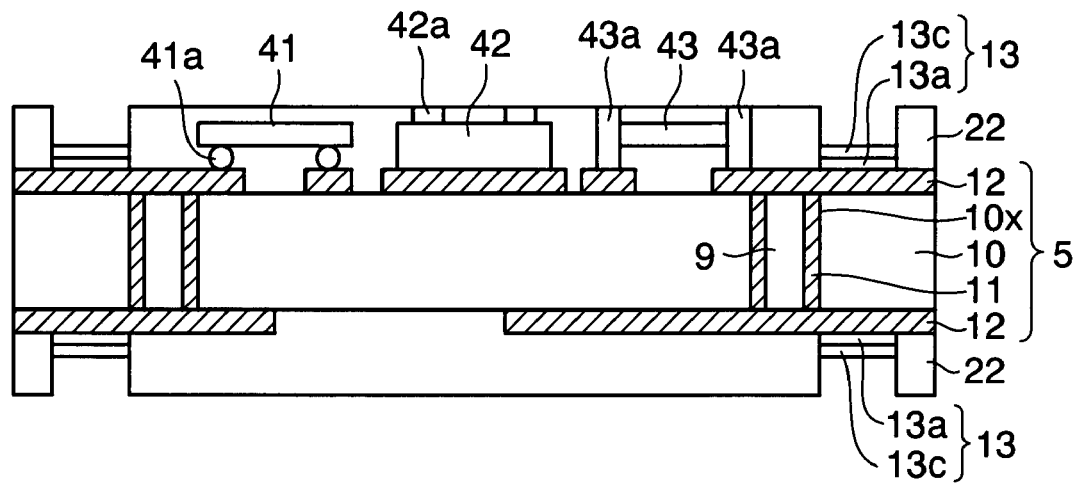
FIGS. 10A and 10B are sectional views showing a method of manufacturing an electronic component built-in substrate according to a second embodiment of the present invention.
Figure 10B:
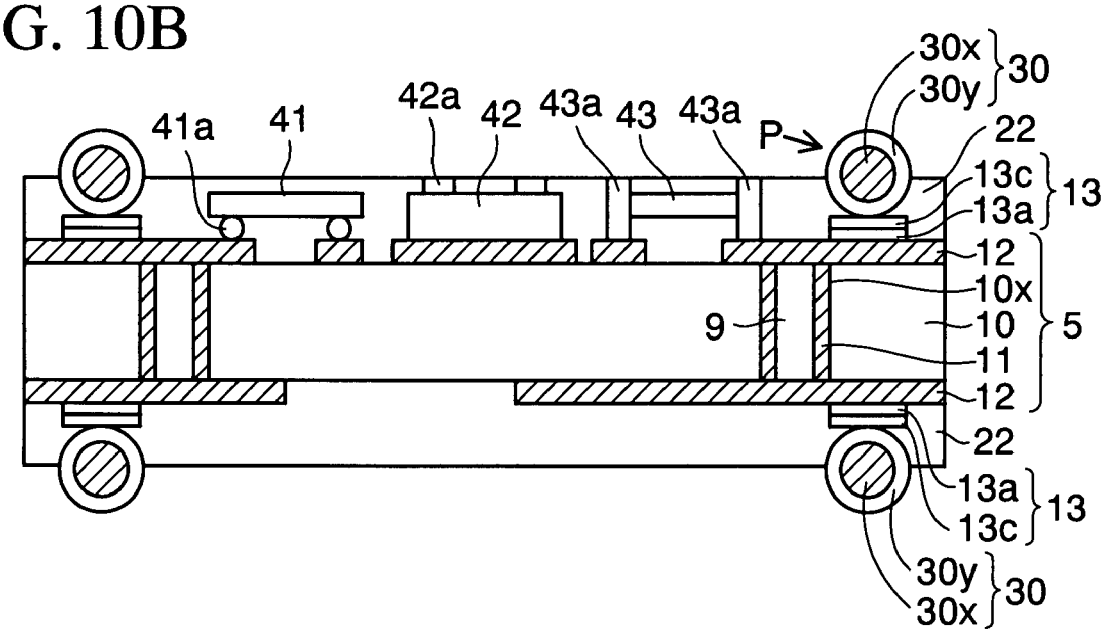
Figure 11:
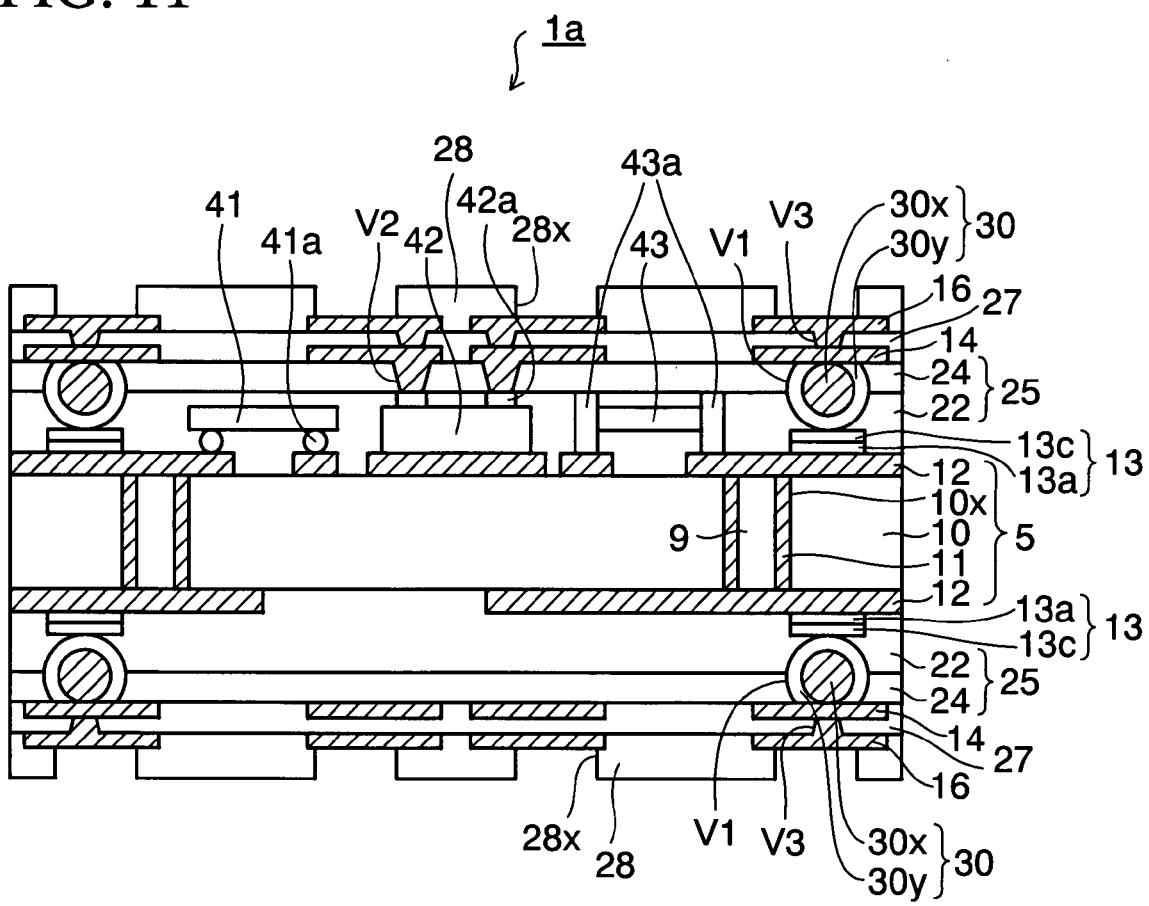
FIG. 11 is a sectional view showing an electronic component built-in substrate according to the second embodiment of the present invention.

FIGS. 10A and 10B are sectional views showing a method of manufacturing an electronic component built-in substrate according to a second embodiment of the present invention, and FIG. 11 is a sectional view showing the same electronic component built-in substrate. A difference of the second embodiment from the first embodiment is that the material of the connection portion on the bottom of the first via hole in which the conductive ball is arranged is different. Therefore, detailed explanation of the same steps as those in the first embodiment will be omitted herein.

As shown in FIG. 10A, first, the structural body in which the same first via holes V1 as those shown in FIG. 2D in the first embodiment are provided is prepared. Then, the connection portions 13 are formed by forming sequentially the nickel (Ni) layer 13a and a gold (Au) layer 13c on the portions of the first wiring layer 12 in the first via holes V1 on both surface sides of the mounted body 5. In the second embodiment, the gold layer 13c is used instead of the solder layer 13b of the connection portion 13 in the first embodiment.

Then, as shown in FIG. 10B, like the first embodiment, the conductive balls 30 are inserted into the first via holes V1 on both surface sides of the mounted body 5 and arranged there. In the second embodiment, the fifth and sixth conductive balls 35, 36, the outermost surface of which is formed of the solder layer 30d, out of the first to sixth conductive balls 31 to 36 shown in FIG. 4 to FIG. 9 are used.

Then, the solder layers 30d of the conductive balls 30 are melt by the reflow heating. Thus, the conductive balls 30 and the gold layers 13c of the connection portions 13 on the bottom portions of the first via holes V1 are joined together. In this manner, in the second embodiment, the lower portions of the conductive balls 30 are connected to the connection portions 13 in the first via holes V1 by the solder joining.

Then, as shown in FIG. 11, an electronic component built-in substrate 1a having the same structure as that in FIG. 3 can be obtained by carrying out the steps from FIG. 2 to FIG. 3 in the first embodiment. In FIG. 11, since the elements except the materials of the connection portions 13 in the first via holes V1 are same as those in FIG. 3 in the first embodiment, their detailed explanation will be omitted herein.

The second embodiment can achieve the similar advantages to those in the first embodiment.

What is claimed is:

1. A method of manufacturing an electronic component built-in substrate, comprising the steps of:
   mounting an electronic component on a mounted body having a first wiring layer;
   forming an insulating layer in which the electronic component is embedded;
   forming a structure in which, a conductive ball constructed by a ball portion and a coating portion for coating the ball portion is connected to the first wiring layer to pass through the insulating layer, and the ball portion and the coating portion are formed of different metal materials, and the coating portion of the upper portion of the conductive ball is removed to reach the ball portion; and
   forming a second wiring layer, which contacts the ball portion and is directly connected to the ball portion, on the insulating layer.

2. A method of manufacturing an electronic component built-in substrate according to claim 1, wherein the step of forming the structure includes the steps of:
   forming a via hole reaching the first wiring layer in the insulating layer;
   inserting the conductive ball into the via hole in a state that an upper portion side of the conductive ball constitutes projected portion that projects from an upper surface of the insulating layer;
   forming a coating insulating layer to coat the projected portion of the conductive ball; and
   polishing the coating insulating layer and the coating portion of the conductive ball until the ball portion of the upper portion of the conductive ball is exposed.

3. A method of manufacturing an electronic component built-in substrate according to claim 2, wherein in the conductive ball, the ball portion is formed of a copper ball, and the coating portion is formed of a solder layer.

4. A method of manufacturing an electronic component built-in substrate according to claim 2, further comprising the step of:

forming a connection portion, an outermost layer of which is formed of a solder layer on a portion of the first wiring layer in the via hole, after the step of forming the via hole; and wherein, in the step of inserting the conductive ball, the conductive ball is joined to the connection portion by reflowing the solder layer of the connection portion.

5. A method of manufacturing an electronic component built-in substrate according to claim 2, further comprising the step of:

forming a connection portion, an outermost layer of which is formed of a gold layer, on a portion of the first wiring layer in the via hole, after the step of forming the via hole; and wherein in the conductive ball, the ball portion is formed of a copper ball and the coating portion is formed of a solder layer, and the conductive ball is joined to the connection portion by reflowing the solder layer of the conductive ball, in the step of inserting the conductive ball.

6. An electronic component built-in substrate, comprising:

a mounted body having a first wiring layer;

an electronic component mounted on the mounted body;

an insulating layer in which the electronic component is embedded;

a conductive ball arranged to pass through the insulating layer, and connected electrically to the first wiring layer; and a second wiring layer formed on the insulating layer, and connected electrically to the conductive ball, wherein the conductive ball is constructed by a ball portion and a coating portion for coating the ball portion, and the ball portion and the coating portion are formed of different metal materials, and the coating portion of the upper portion of the conductive ball is removed to reach the ball portion, and the second wiring layer contacts the ball portion and is directly connected to the ball portion.

7. An electronic component built-in substrate according to claim 6, wherein in the conductive ball, the ball portion is formed of a copper ball, and the coating portion is formed of a solder layer, and the solder layer is connected to first wiring layer.

8. An electronic component built-in substrate according to claim 6, wherein a resin body is filled into a center portion of the conductive ball.

9. An electronic component built-in substrate according to claim 6, further comprising:

an upper insulating layer formed on the insulating layer and the second wiring layer;

an upper via hole formed in the upper insulating layer to reach a portion of the second wiring layer corresponding to the conductive ball; and a third wiring layer formed on the upper insulating layer and connected to the second wiring layer via the upper via hole.

* * * * *